(12) United States Patent
Yoo et al.

(10) Patent No.: US 8,513,781 B2
(45) Date of Patent: Aug. 20, 2013

(54) DEVICE FOR REMOVING ELECTROMAGNETIC INTERFERENCE AND SEMICONDUCTOR PACKAGE INCLUDING THE SAME

(75) Inventors: Jae-Wook Yoo, Suwon-si (KR); Kyoung-Sei Choi, Yongin-si (KR); Yun-Seok Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 113 days.

(21) Appl. No.: 13/083,931

(22) Filed: Apr. 11, 2011

(65) Prior Publication Data

US 2011/0304364 A1 Dec. 15, 2011

(30) Foreign Application Priority Data

Jun. 15, 2010 (KR) .................. 10-2010-0056754

(51) Int. Cl.
 *H01L 21/56* (2006.01)
(52) U.S. Cl.
 USPC ........................................... 257/659
(58) Field of Classification Search
 USPC ......... 257/659, 678, 728, 414–416; 327/147; 361/306.1
 See application file for complete search history.

(56) References Cited

U.S. PATENT DOCUMENTS

| | | | |
|---|---|---|---|
| 2006/0068856 A1* | 3/2006 | Zhu et al. ............... | 455/575.1 |
| 2006/0202312 A1* | 9/2006 | Iijima et al. ............. | 257/664 |
| 2007/0097010 A1* | 5/2007 | Mohamadi .............. | 343/795 |
| 2008/0079652 A1* | 4/2008 | Mohamadi .............. | 343/893 |
| 2008/0158081 A1* | 7/2008 | Rofougaran ............ | 343/787 |
| 2008/0191951 A1* | 8/2008 | Kato ....................... | 343/722 |
| 2009/0073634 A1* | 3/2009 | Lee et al. ................ | 361/303 |
| 2009/0085182 A1* | 4/2009 | Yamazaki et al. ....... | 257/679 |
| 2009/0102740 A1* | 4/2009 | Rofougaran ............ | 343/860 |

FOREIGN PATENT DOCUMENTS

| | | |
|---|---|---|
| JP | 2004111600 A | 4/2004 |
| JP | 2009081175 A | 4/2009 |
| KR | 20050095736 A | 9/2005 |

* cited by examiner

*Primary Examiner* — Nathan Ha
(74) *Attorney, Agent, or Firm* — Harness, Dickey & Pierce P.L.C.

(57) ABSTRACT

Provided is an electromagnetic interference (EMI) removing device for active reduction of electromagnetic interference and a semiconductor package including the same. The EMI removing device may include a film substrate having an antenna pattern configured to generate a second electromagnetic wave, which may have substantially the same frequency band, modulation mode, and directivity as a first electromagnetic wave generated by a first semiconductor chip and a phase opposite to a phase of the first electromagnetic wave.

24 Claims, 9 Drawing Sheets

DEVICE FOR REMOVING ELECTROMAGNETIC INTERFERENCE AND SEMICONDUCTOR PACKAGE INCLUDING THE SAME

CROSS-REFERENCE TO RELATED APPLICATIONS

This application claims priority under 35 U.S.C. §119 to Korean Patent Application No. 10-2010-0056754, filed on Jun. 15, 2010, in the Korean Intellectual Property Office (KIPO), the disclosure of which is incorporated herein in its entirety by reference.

BACKGROUND

1. Field

Example embodiments of the inventive concepts relate to a device for removing electromagnetic interference and a semiconductor package including the same, and more particularly, to a device for active reduction of electromagnetic interference and a semiconductor package including the same.

2. Description of the Related Art

As the drive frequency of a semiconductor package increases, problems, including electromagnetic interference (EMI), occur. The EMI interferes with operations of nearby electronic devices, for example, semiconductor packages, and induces malfunctions thereof. Therefore, regulations related to the maximum permissible emission of EMI with respect to electronic devices are being established, and it may be important to consider the regulations while an electronic device is being designed.

SUMMARY

Example embodiments of the inventive concepts provide a device for active reduction of electromagnetic interference and a semiconductor package including the same.

In accordance with example embodiments, a semiconductor package may include at least one first semiconductor chip and an electromagnetic interference (EMI) removing device arranged outside the at least one first semiconductor chip. In example embodiments, the at least one first semiconductor chip may be configured to generate a first electromagnetic wave and the (EMI) removing device may be configured to generate a second electromagnetic wave having a phase opposite to a phase of the first electromagnetic wave.

In accordance with example embodiments, an EMI removing device may include a film substrate having an antenna pattern configured to generate a second electromagnetic wave having a same frequency band, modulation mode, and directivity as a first electromagnetic wave generated by a first semiconductor chip. In example embodiments, the second electromagnetic wave may have a phase opposite to a phase of the first electromagnetic wave.

In accordance with example embodiments, an EMI removing device may include a first adhesive layer, a base film on the first adhesive layer, an antenna pattern and a wiring pattern on the base film, and a drive circuit on the base film. In example embodiments, the drive circuit may include an oscillation unit and a modulation unit configured to generate and transmit a modulated signal to the antenna pattern.

In accordance with example embodiments of the inventive concepts, a semiconductor package may include at least one first semiconductor chip, which may generate a first electromagnetic wave, and an electromagnetic interference (EMI) removing device arranged outside the first semiconductor chip, wherein the EMI removing device is configured to generate a second electromagnetic wave having a phase opposite to a phase of the first electromagnetic wave.

In example embodiments, the first electromagnetic wave and the second electromagnetic wave may have the same frequency band, modulation mode, and directivity.

In example embodiments, the EMI removing device may include a sealing member, a film substrate, and a drive circuit. In example embodiments, the sealing member may seal the first semiconductor chip, the film substrate may be arranged on the sealing member and may include an antenna pattern, and the drive circuit may be configured to generate a modulated signal for generating the second electromagnetic wave and transmitting the modulated signal to the antenna pattern.

In example embodiments, the semiconductor package may further include a second semiconductor chip, in which the drive circuit is embodied, wherein the second semiconductor chip may be mounted on the film substrate.

In example embodiments, the film substrate may further include at least one via contact electrically connected to the drive circuit, wherein the via contact may contact a lead frame or a through mold via (TMV), exposed by the sealing member.

In example embodiments, the semiconductor package may further include a fixing unit, which may fix the film substrate and the first semiconductor chip. Furthermore, the film substrate may include a base film and a first adhesive layer between the base film and the sealing member, wherein the antenna pattern may be arranged on a first surface of the base film.

In example embodiments the film substrate may further include a second adhesive layer and a protective layer on the second adhesive layer. In example embodiments, the second adhesive layer may cover the antenna pattern. Furthermore, the antenna pattern may be configured to generate the second electromagnetic wave, which may have the substantially same directivity as the first electromagnetic wave.

In example embodiments, the drive circuit may include an oscillation unit that may be configured to generate an oscillating signal having the same frequency band as the first electromagnetic wave. In addition, the drive circuit may include a modulation unit which may be configured to generate the modulated signal for generating the second electromagnetic wave of the antenna pattern, based on the oscillating signal.

In example embodiments, the oscillation unit may include a plurality of oscillation units, and the drive circuit may further include a first selection unit, which may be configured to select at least one oscillation unit from among the plurality of oscillation units. In the same regard, the modulation unit may include a plurality of modulation units, and the drive circuit may further include a second selection unit, which may be configured to select at least one modulation unit from among the plurality of modulation units.

In example embodiments, the oscillation unit may include a crystal oscillator, a voltage-controlled oscillator, a divider, a phase detector, and a pulse-voltage converter. In example embodiments, the crystal oscillator may be configured to generate a first signal having a first frequency, the voltage-controlled oscillator may be configured to generate a second signal having a second frequency, the phase detector may generate a pulse signal based on a difference between the phase of the first signal and the phase of the comparative signal, and the pulse-voltage converter may be configured to convert the pulse signal to the parameter voltage. In example embodiments the second signal having the second frequency generated by the voltage-controlled oscillator may be higher than the first frequency, based on a parameter voltage.

In accordance with example embodiments, a semiconductor package may include at least one first semiconductor chip which generates a first electromagnetic wave, a sealing member which seals the first semiconductor chip, a film substrate which is arranged on the sealing member and includes an antenna pattern configured to generate a second electromagnetic wave, and a second semiconductor chip, which is mounted on the film substrate, wherein the second electromagnetic wave has the same frequency band, modulation mode, and directivity as the first electromagnetic wave and has a phase opposite to a phase of the first electromagnetic wave, and the second semiconductor chip is configured to generate a modulated signal for generating the second electromagnetic wave and transmitting the modulated signal to the antenna pattern.

In example embodiments, the semiconductor package may be mounted on a board, and the shape of the antenna pattern may be determined based on the type of the board.

In example embodiments, the second semiconductor chip may include a plurality of oscillation units and a plurality of modulation units. In example embodiments, the plurality of oscillation units may be configured to generate oscillating signals having the same frequency band as the first electromagnetic wave and the plurality of modulation units may be configured to generate modulated signals, wherein the modulated signals have the same modulation mode as the first electromagnetic wave and have a phase opposite to a phase of the first electromagnetic wave, based on the oscillating signals.

In example embodiments, the second semiconductor chip may further include an address generating unit, a first selection unit, and a second selection unit. The address generating unit may be configured to generate a first address and a second address based on the type of the board. The first selection unit may be configured to select at least one oscillation unit from amount the plurality of oscillation units according to the first address. The second selection unit may be configured to select at least one modulation unit from among the plurality of modulation units according to the second address.

In accordance with example embodiments, an electromagnetic interference (EMI) removing device may include a film substrate having an antenna pattern configured to generate a second electromagnetic wave, which has the same frequency band, modulation mode, and directivity as a first electromagnetic wave generated by a first semiconductor chip and has a phase opposite to a phase of the first electromagnetic wave.

In example embodiments, the EMI removing device may further include a semiconductor chip mounted on the film substrate, wherein the semiconductor chip may be configured to generate a modulated signal for generating the second electromagnetic wave and transmit the modulated signal to the antenna pattern.

In example embodiments, the film substrate may include a base film, a first adhesive layer, a second adhesive layer, and a protective layer. In example embodiments, the base film may have a first surface and a second surface opposite to the first surface and an antenna pattern arranged thereon. The first adhesive layer may be on the first surface of the base film, the second adhesive layer may be on the second surface of the base film and may cover the antenna pattern. The protective layer may be on the second adhesive layer.

BRIEF DESCRIPTION OF THE DRAWINGS

Example embodiments of the inventive concepts will be more clearly understood from the following detailed description, taken in conjunction with the accompanying drawings in which.

DETAILED DESCRIPTION OF EXAMPLE EMBODIMENTS

Example embodiments of the inventive concepts will now be described more fully with reference to the accompanying drawings, in which example embodiments of the inventive concepts are shown.

The inventive concepts may, however, be embodied in many different forms and should not be construed as being limited to example embodiments set forth herein; rather, example embodiments are provided so that this disclosure will be thorough and complete, and will fully convey the concepts of the inventive concepts to those skilled in the art.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concepts.

Example embodiments of the inventive concepts are described herein with reference to cross-section illustrations that are schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Figure 1:
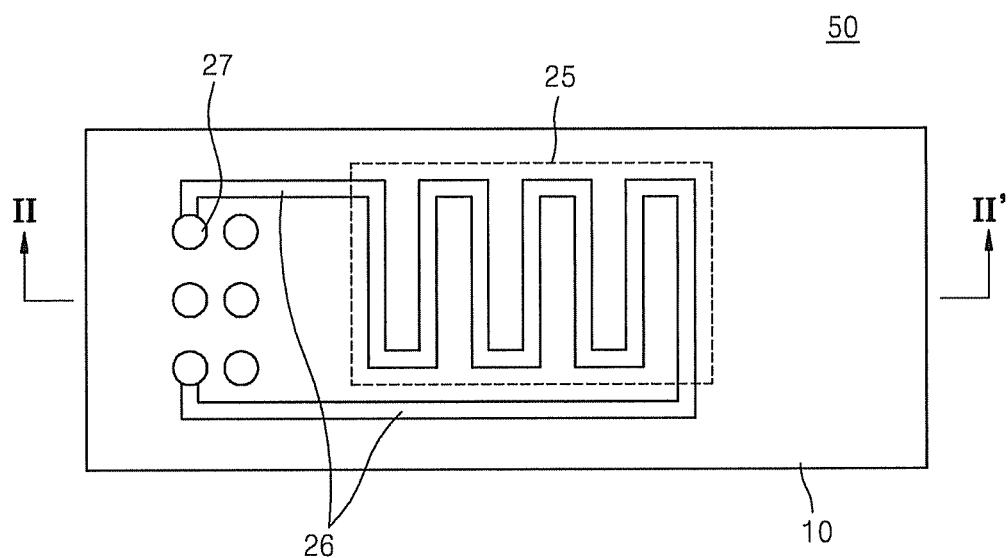
FIG. 1 is a plan view of a film substrate of an electromagnetic interference (EMI) removing device, according to example embodiments of the inventive concepts.
Figure 2:
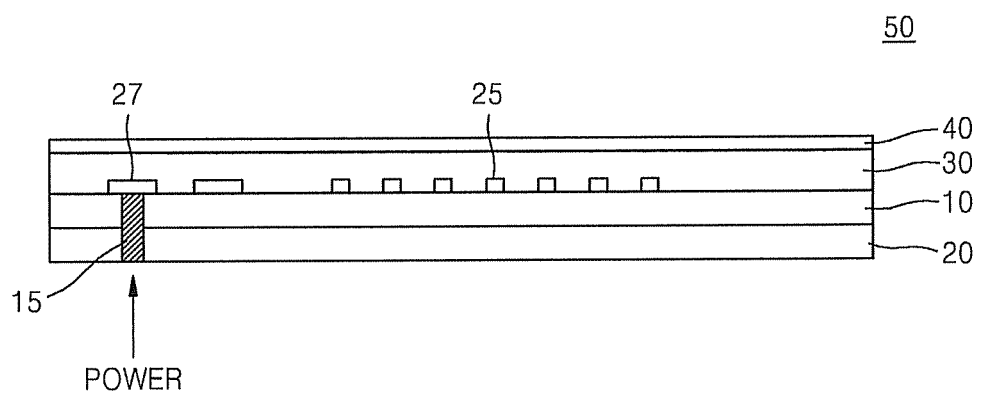
FIG. 2 is a sectional view taken along a line II-II' of FIG. 1.
Figure 3:
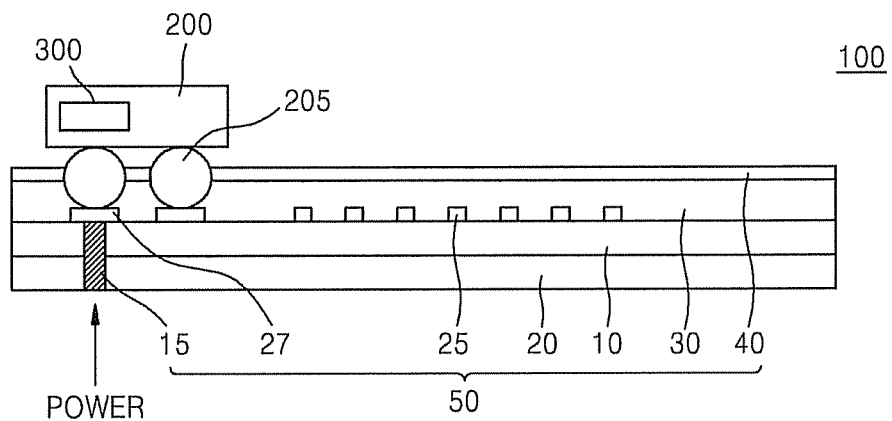
FIG. 3 is a sectional view of an EMI removing device in which a semiconductor chip may be mounted on the film substrate of FIG. 1.

FIG. 1 illustrates a plan view of a film substrate 50 of an electromagnetic interference (EMI) removing device, according to example embodiments of the inventive concepts. FIG. 2 illustrates a sectional view taken along a line II-II' of FIG. 1. FIG. 3 illustrates a sectional view of an EMI removing device 100 which includes a semiconductor chip 200 mounted on the film substrate 50 of FIG. 1.

Referring to FIGS. 1 through 3, the EMI removing device 100, which may include the film substrate 50 and a drive circuit 300, and a method of manufacturing the EMI removing device 100, according to example embodiments of the inventive concepts, will be described.

Referring to FIGS. 1 and 2, the film substrate 50 may be a rigid film substrate or a flexible film substrate. To form the film substrate 50, a base film 10 is prepared. The base film 10 may exhibit excellent stability at a high temperature and excellent insulation, and may include a material, which is rigid at room temperature and is flexible at a high temperature. For example, the base film 10 may be a polyimide film, a polyester film, or a polyamide film.

A first adhesive layer 20 may be formed on a first surface of the base film 10. The first adhesive layer 20 may be a high temperature tape that is well known in the art, for example, a glass tape, a silicon tape, a Teflon tape, or a stainless foil tape. Furthermore, the first adhesive layer 20 may be a tape containing aluminum oxide, aluminum nitride, silicon oxide, or beryllium oxide.

Before, during, or after the first adhesive layer 20 is formed on the base film 10, an antenna pattern 25 and a wiring pattern 26 may be formed on a second surface of the base film 10. The antenna pattern 25 and the wiring pattern 26 may be formed by using a method that uses a conductive material, for example, a printing method, a jetting method, or an imprinting method. Then, at least one bump pad 27 is formed on at least one of the ends of the wiring pattern 26. The bump pad 27 may be formed by using various known methods, for example, a dotting method. In FIGS. 1-3 the antenna pattern 25, the wiring pattern 26, and the bump pads 27 are illustrated as being on the second surface of the base film 10. However, example embodiments are not limited thereto as the antenna pattern 25, the wiring pattern 26, and the bump pads 27 may, in the alternative be formed on the first surface of the base film 10.

In example embodiments, a second adhesive layer 30 may be formed on the base film 10 and the second adhesive layer 30 may cover the antenna pattern 25, the wiring pattern 26, and the bump pad 27. The second adhesive layer 30 may be formed of the same material as the first adhesive layer 20 or may be formed of a different material from that of the first adhesive layer 20. In example embodiments, the second adhesive layer 30 may be removed from above the bump pad 27 or may be pushed away from the top surface of the bump pad 27 by predetermined heat and pressure (while protecting the antenna pattern 25, the wiring pattern 26, and the bump pad 27) to expose the top surface of the bump pad. Thus, a conductive member 205 of the semiconductor chip 200, for example, a solder ball, may be electrically connected to the bump pad 27. In example embodiments, a protection layer 40 may be formed on the second adhesive layer 30. The protection layer 40 may include a material that may easily attach to and detach from the second adhesive layer 30.

Selectively, a first via contact 15 may be additionally formed to penetrate the base film 10 and the first adhesive layer 20. For example, the first via contact 15 may receive a power signal and may transmit the power signal to the drive circuit 300.

Referring to FIG. 3, the semiconductor chip 200 may be mounted on the film substrate 50. The film substrate 50 may be fixed onto a sealing member (550 of FIG. 5), and, by electrically connecting the conductive member 205 of the semiconductor chip 200 to the bump pad 27 before, during, or after the film substrate 50 is fixed onto the sealing member (550 of FIG. 5), the semiconductor chip 200 may be mounted on the film substrate 50.

The semiconductor chip 200 may include the drive circuit 300, which may be configured to transmit a modulated signal to the antenna pattern 25. The modulated signal may be used to generate an electromagnetic wave for removing EMI. The drive circuit 300 will be described below in detail with reference to FIGS. 6 and 7.

Figure 4:
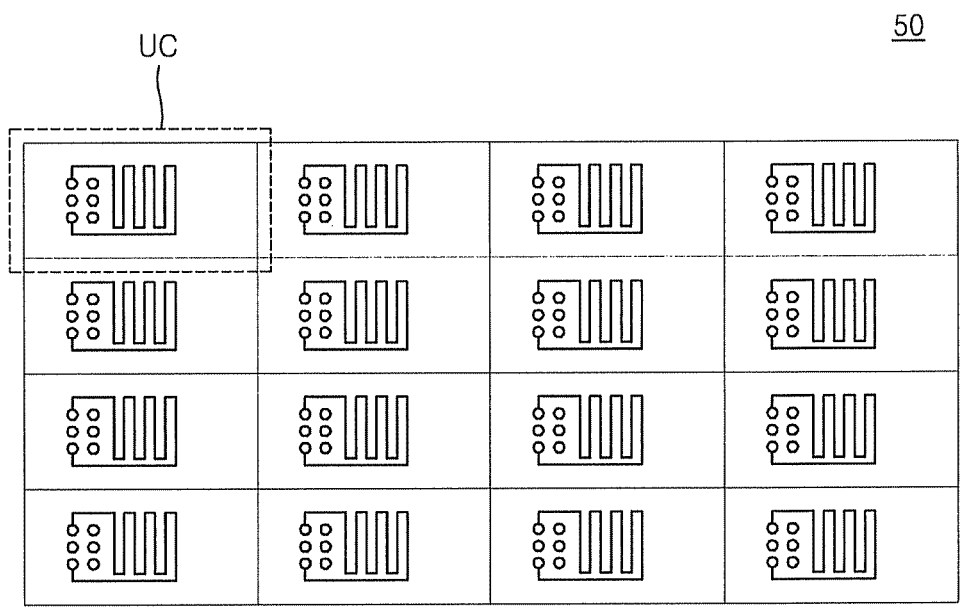
FIG. 4 is a plan view of the film substrate on which a plurality of the EMI removing devices are formed.

FIG. 4 is a plan view of the film substrate 50 on which a plurality of the EMI removing devices 100 may be formed. In other words, FIG. 4 shows the plurality of EMI removing devices 100 before being separated.

Referring to FIG. 4, the film substrate 50 may include a plurality of unit cells UC. The unit cells UC may be formed to have the same pattern. The unit cells UC may be separated from each other and each of the separated unit cells UC may be used for removing EMI. Furthermore, the film substrate 50, including the plurality of unit cells UC, may be rolled for easy maintenance and transportation.

Figure 5:
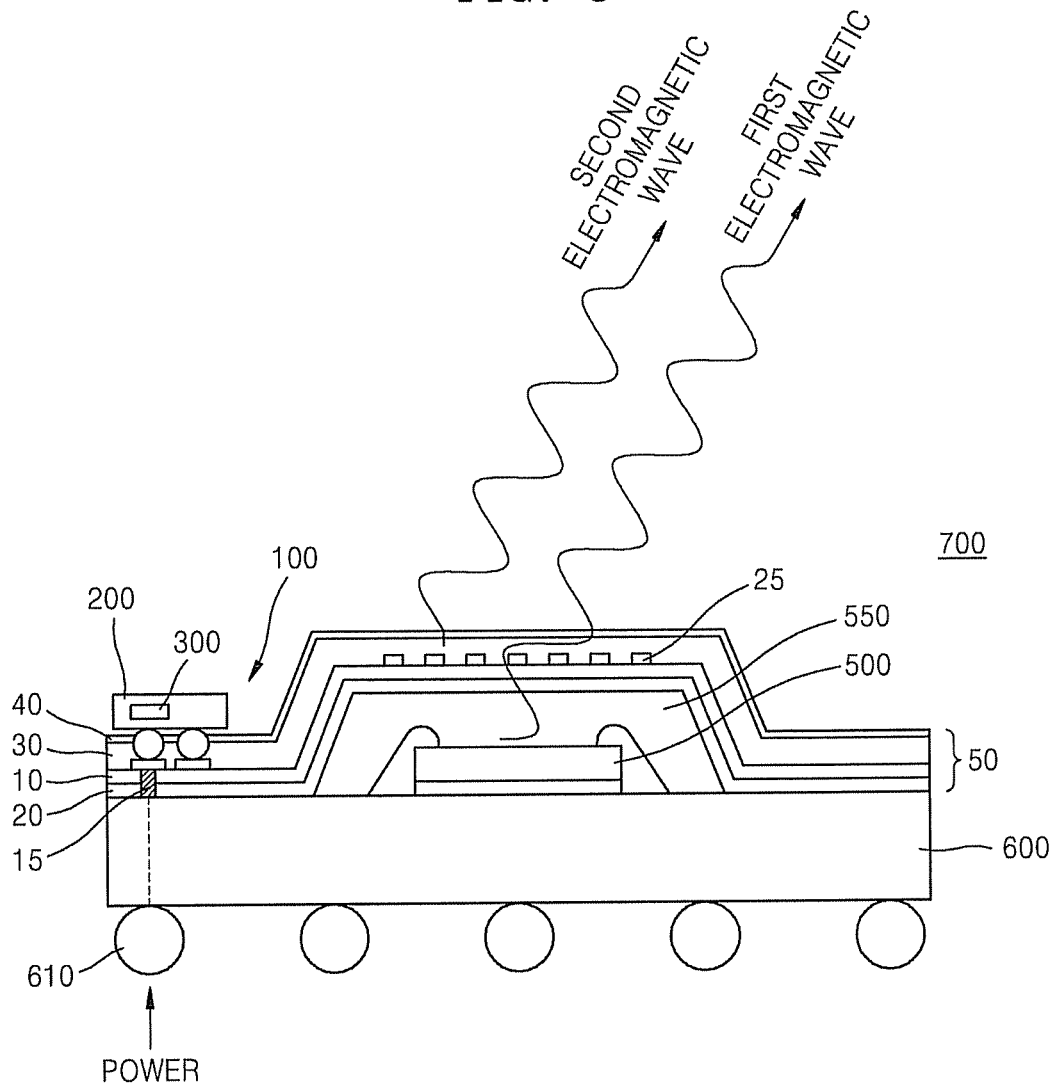
FIG. 5 is a sectional view of a semiconductor package according to example embodiments of the inventive concepts.

FIG. 5 is a sectional view of a semiconductor package 700 according to example embodiments of the inventive concepts.

Referring to FIG. 5, the EMI removing device 100 may be arranged on a substrate 600 on which a first semiconductor chip 500 may be mounted. In example embodiments, the first semiconductor chip 500 may be covered by a sealing member 550 which seals and protects the first semiconductor chip 500. In detail, the first adhesive layer 20 of the film substrate 50 of the EMI removing device 100 may be attached to the sealing member 550. In this manner, the EMI removing device 100 may be fixed onto the first semiconductor chip 500. In other words, the EMI removing device 100 may be arranged outside of the first semiconductor chip 500, and, in detail, since the EMI removing device 100 may be embodied on the detachable tape type film substrate 50, another EMI removing device with a new design may be easily applied according to environment, for example, a working environment.

The first semiconductor chip 500 mounted on the substrate 600 may generate a first electromagnetic wave. The first electromagnetic wave may have particular frequency band, modulation mode, directivity, and phase, during operation. The first electromagnetic wave may interfere with the operation of a nearby semiconductor chip (not shown) or a nearby semiconductor package (not shown) and may induce malfunctions thereof. However, the effects of the first electromagnetic fields on nearby semiconductor devices may be removed or reduced by an operation of the EMI removing device. For example, in example embodiments, the EMI removing device 100 may generate a second electromagnetic wave having the same frequency band, modulation mode, and directivity of the first electromagnetic wave. However, in example embodiments the second electromagnetic wave may have a phase opposite to the phase of the first electromagnetic wave. Thus, interference of the first electromagnetic wave with respect to surrounding devices may be removed or reduced.

To generate a second electromagnetic wave for removing or reducing interference with respect to surrounding devices, the EMI removing device 100 may include the film substrate 50 according to example embodiments. In example embodiments, the film substrate 50 may include the antenna pattern 25 and the drive circuit 300 for driving the antenna pattern 25.

The film substrate 50 may include the antenna pattern 25, the wiring pattern 26, the bump pad 27, the base film 10, the first adhesive layer 20, the second adhesive layer 30, and the protection layer 40 as described above with reference to FIGS. 1 through 4. Therefore, detailed descriptions thereof will be omitted below.

The drive circuit 300 may generate a modulated signal for generating a second electromagnetic wave. Furthermore, the drive circuit 300 may transmit the generated modulated signal to the antenna pattern 25, and the antenna pattern 25 may generate a second electromagnetic wave according to the modulated signal. The drive circuit 300 may be embodied in the semiconductor chip 200 mounted on the film substrate 50.

The first via contact 15 may be electrically connected to the substrate 600. Therefore, the first via contact 15 may receive a power signal from an external terminal 610 of the substrate 600 and transmit the power signal to the drive circuit 300 of the EMI removing device 100. For example, when the drive circuit 300 is embodied in the second semiconductor chip 200, the power signal received by the first via contact 15 may be transmitted to the drive circuit 300 in the second semiconductor chip 200 via the bump pad 27 and the conductive member 205 of the second semiconductor chip 200.

Figure 6:
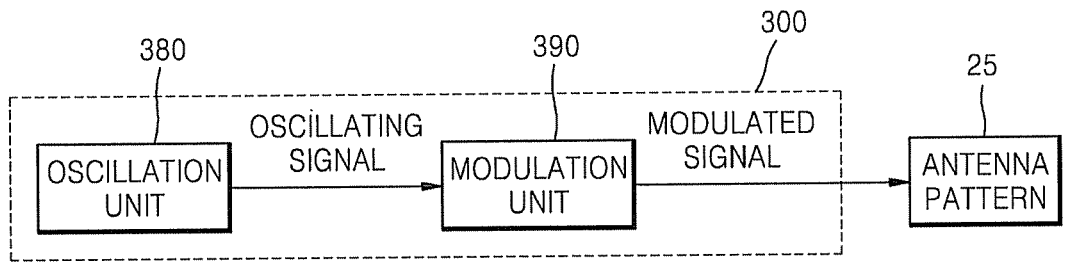
FIG. 6 is a block diagram of the drive circuit in the semiconductor package 700, according to example embodiments of the inventive concepts.
Figure 7:
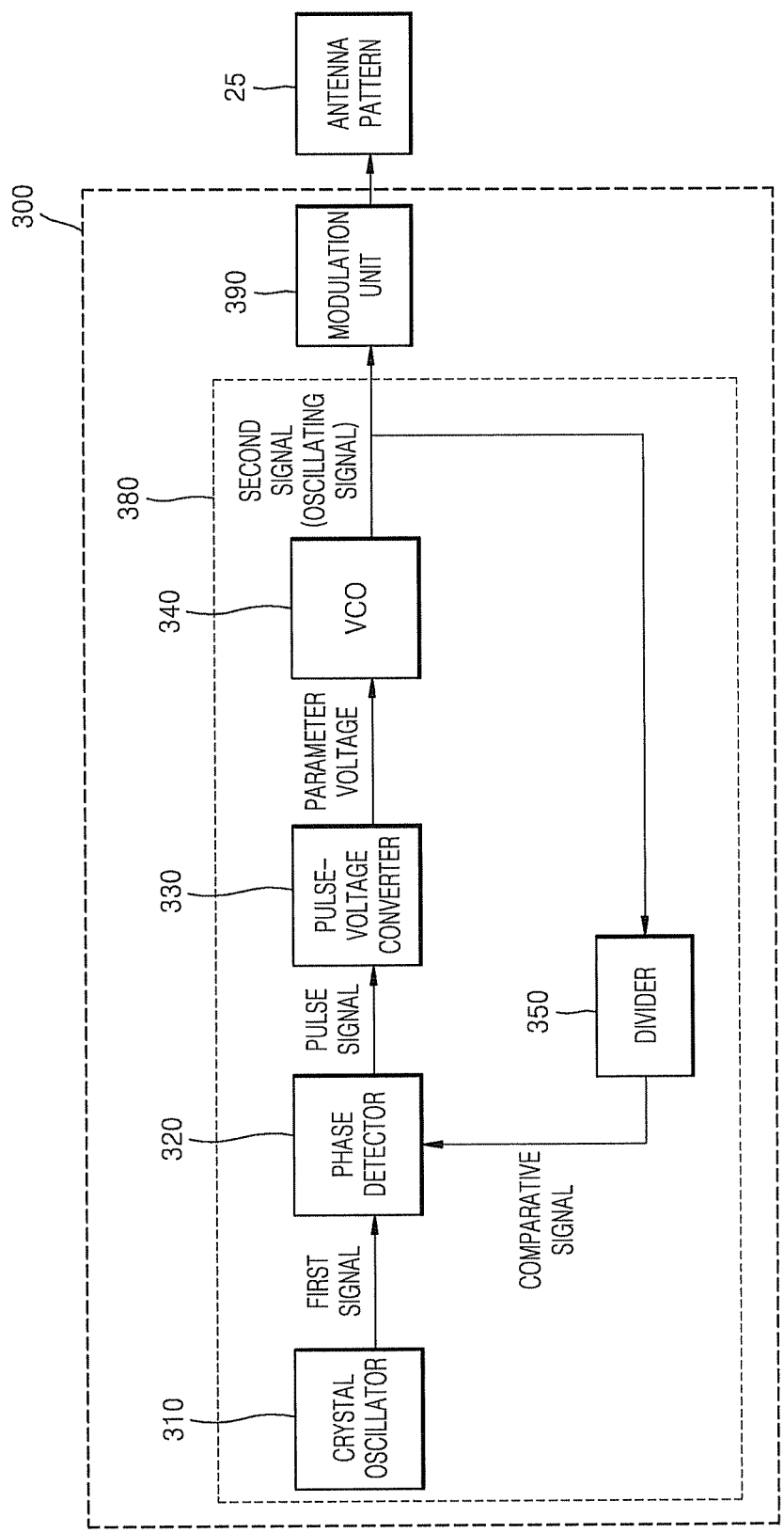
FIG. 7 is a block diagram of the drive circuit, showing an oscillation unit 380 of the drive circuit in closer detail.

FIG. 6 illustrates a block diagram of the drive circuit 300 in the semiconductor package 700, according to example embodiments of the inventive concepts. FIG. 7 illustrates a block diagram of the drive circuit 300, showing an oscillation unit 380 of the drive circuit 300 in closer detail.

Referring to FIG. 6, the drive circuit 300 may generate a modulated signal for generating a second electromagnetic wave, which has. the same frequency band, modulation mode, and directivity as a first electromagnetic wave and has a phase opposite to the phase of the first electromagnetic wave. In example embodiments, the drive circuit may transmit the modulated signal to the antenna pattern 25. The antenna pattern 25 may receive the modulated signal and generate a second electromagnetic wave, which has the same directivity as a first electromagnetic wave. Therefore, an interference generated by the first electromagnetic wave may be reduced because the second electromagnetic wave (which has the same frequency band, modulation mode, and directivity as a first electromagnetic wave and has a phase opposite to the phase of the first electromagnetic wave) and the first electromagnetic wave offset each other.

In example embodiments, the drive circuit 300 may include the oscillation unit 380 and a modulation unit 390. The oscillation unit 380 may be configured to generate an oscillating signal having the same frequency band as a first electromagnetic wave. The modulation unit 390 may generate a modulated signal for generating a second electromagnetic wave of the antenna pattern 25, based on the oscillating signal. In other words, the modulation unit 390 may be configured to generate a modulated signal for generating a second electromagnetic wave having the same modulation mode as a first electromagnetic wave and a phase opposite to the phase of the first electromagnetic wave.

The antenna pattern 25 may receive the modulated signal and generate the second electromagnetic wave having the same directivity as the first electromagnetic wave. Although FIG. 1 shows a meander type metal pattern as the structure of the antenna pattern 25, example embodiments of the inventive concepts are not limited thereto, and the structure of the antenna pattern 25 may be modified to have the same directivity as a first electromagnetic wave.

Referring to FIG. 7, the oscillation unit 380 may include a crystal oscillator 310, a voltage-controlled oscillator (VCO) 340, a divider 350, a phase detector 320, and a pulse-voltage converter 330.

The crystal oscillator 310 may be an oscillator that generates a first signal having a first frequency (a relatively low frequency). The voltage-controlled oscillator 340 may be configured to generate a second signal having a relatively high frequency, according to a parameter voltage. In other words, the voltage-controlled oscillator 340 may be configured to generate a second signal having a second frequency, wherein the second frequency is higher than the first frequency.

The divider 350 is configured to convert the second signal to a comparative signal having the first frequency (the relatively low frequency). When the second signal having the second frequency is converted to the comparative signal having the first frequency, the phase detector 320 detects a phase difference between the comparative signal and the first signal. In example embodiments, the phase detector 320 may be configured to generate a pulse signal according to the phase difference.

The pulse-voltage converter 330 may be configured to receive the pulse signal and convert the pulse signal to a parameter voltage for controlling the voltage-controlled oscillator 340. Due to the parameter voltage, the voltage-controlled oscillator 340 may generate another second signal, which is a relatively high frequency signal having a constant phase and frequency.

Figure 8:
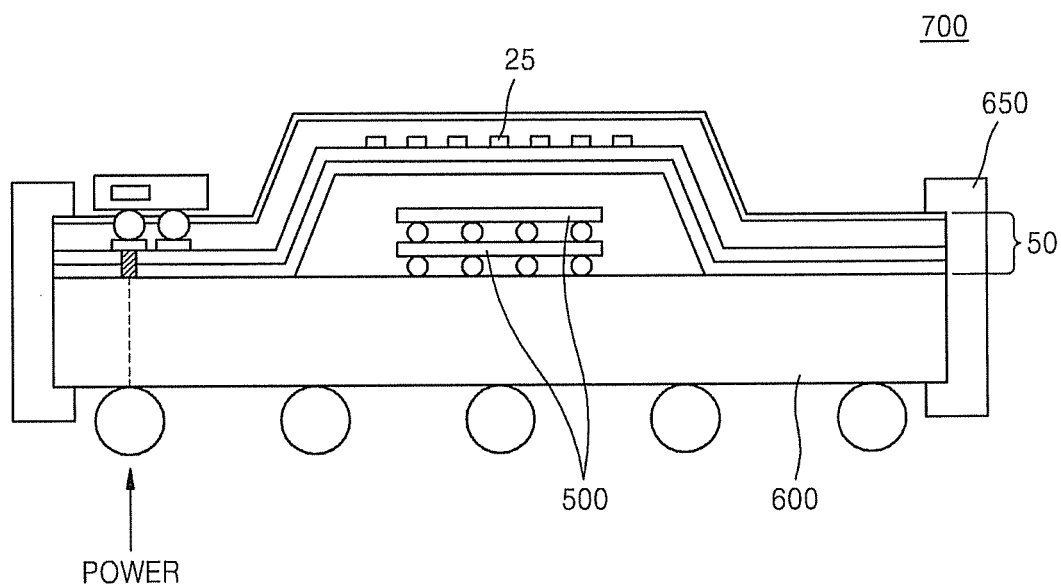
FIG. 8 is a sectional view of the semiconductor package according to example embodiments of the inventive concepts.

FIG. 8 illustrates a sectional view of the semiconductor package 700 according to example embodiments of the inventive concepts. The semiconductor package 700 according to example embodiments is a partial modification of the semiconductor package 700 of FIG. 5. Any descriptions that are the same as the descriptions given above will be omitted below.

Referring to FIG. 8, a plurality of the first semiconductor chips 500 may be stacked. In this case, the antenna pattern 25 may generate a second electromagnetic wave, which has a phase opposite to a phase of a first electromagnetic wave generated by the plurality of first semiconductor chips 500. Therefore, EMI due to the plurality of first semiconductor chips 500 may be reduced by an EMI removing device. Furthermore, the semiconductor package 700 may further include a fixing unit 650, which fixes the film substrate 50 and the substrate 600.

Figure 9:
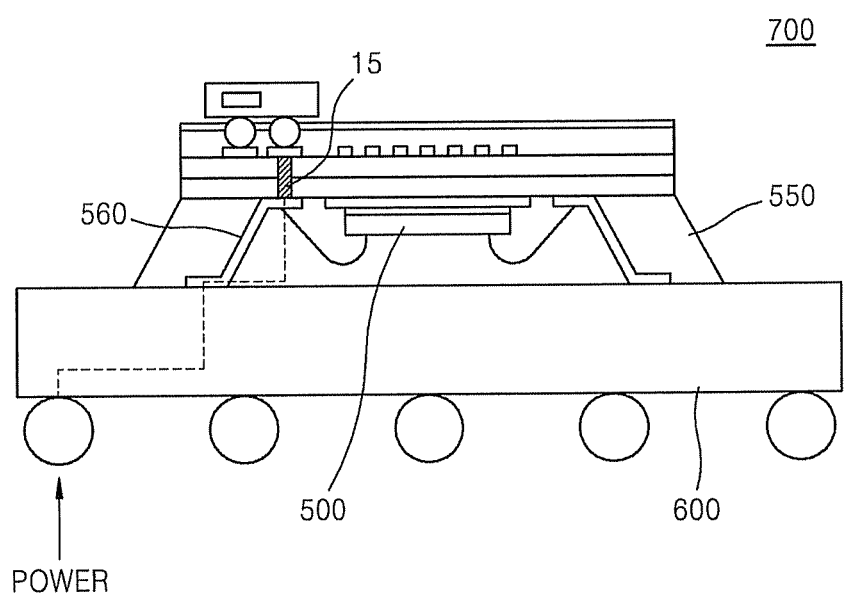
FIGS. 9 and 10 illustrate sectional views of the semiconductor package according to example embodiments of the inventive concepts.
Figure 10:
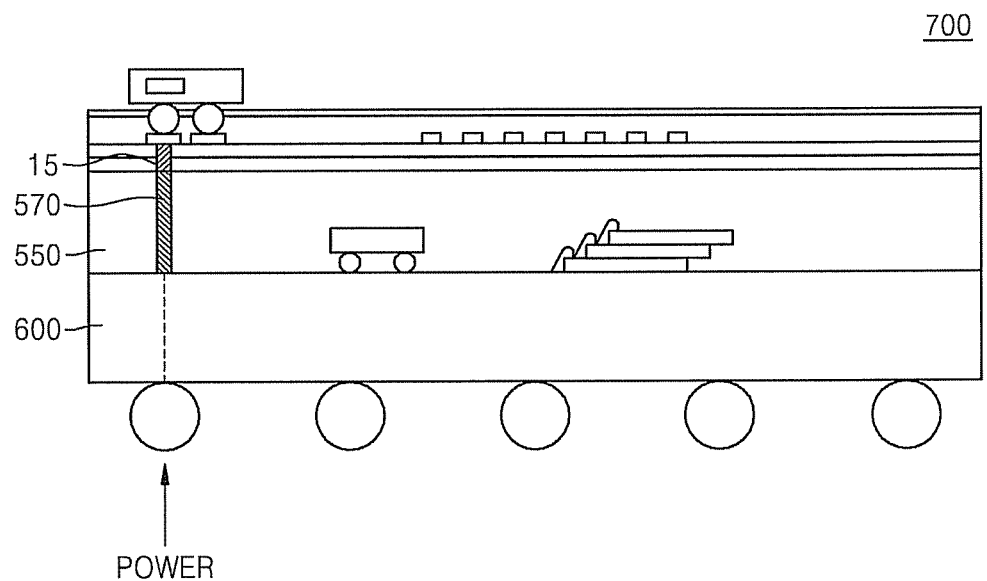

FIGS. 9 and 10 illustrate sectional views of the semiconductor package 700 according to example embodiments of the inventive concepts. The semiconductor package 700 according to example embodiments is a partial modification of the semiconductor package 700 of FIG. 5. Any descriptions that are the same as the descriptions given above will be omitted below.

Referring to FIGS. 9 and 10, the first via contact 15 may contact a lead frame 560 or a through mold via 570, which may be exposed by the sealing member 550. In other words, as opposed to the example embodiments shown in FIG. 5 in which the first via contact 15 is electrically connected to the substrate 600, the first via contact 15 may receive a power signal from the substrate 600 via electrical connection to the lead frame 560 or the through mold via 570 in the sealing member 550.

Figure 11:
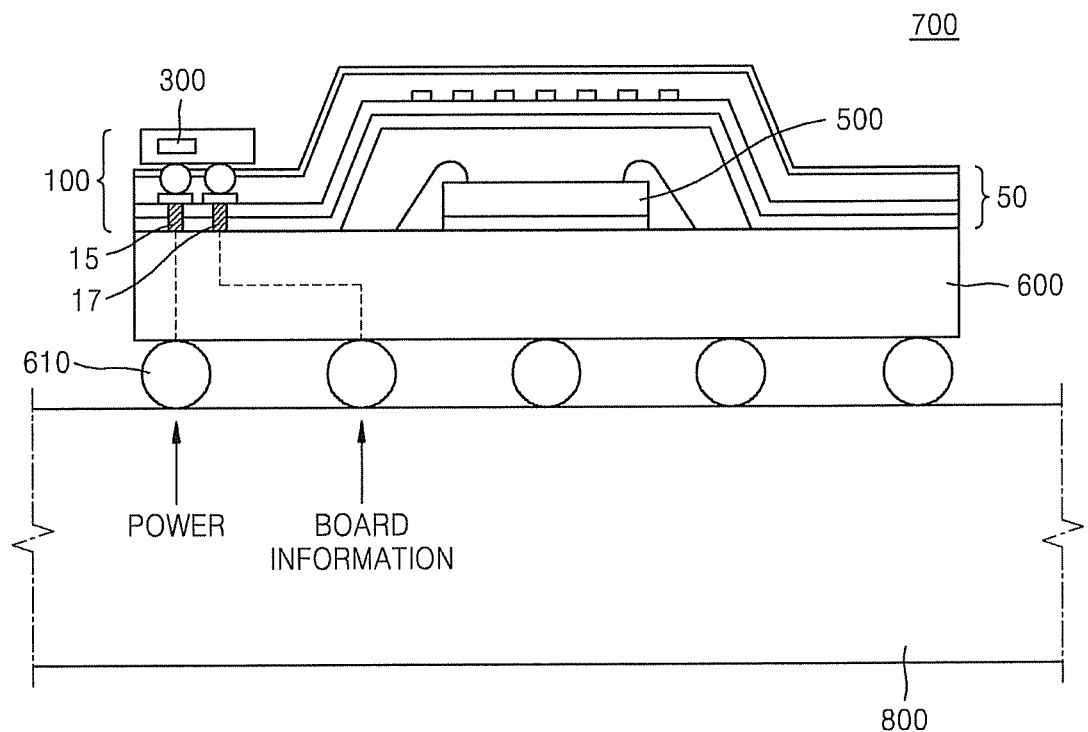
FIG. 11 is a sectional view of the semiconductor package according to example embodiments of the inventive concepts.
Figure 12:
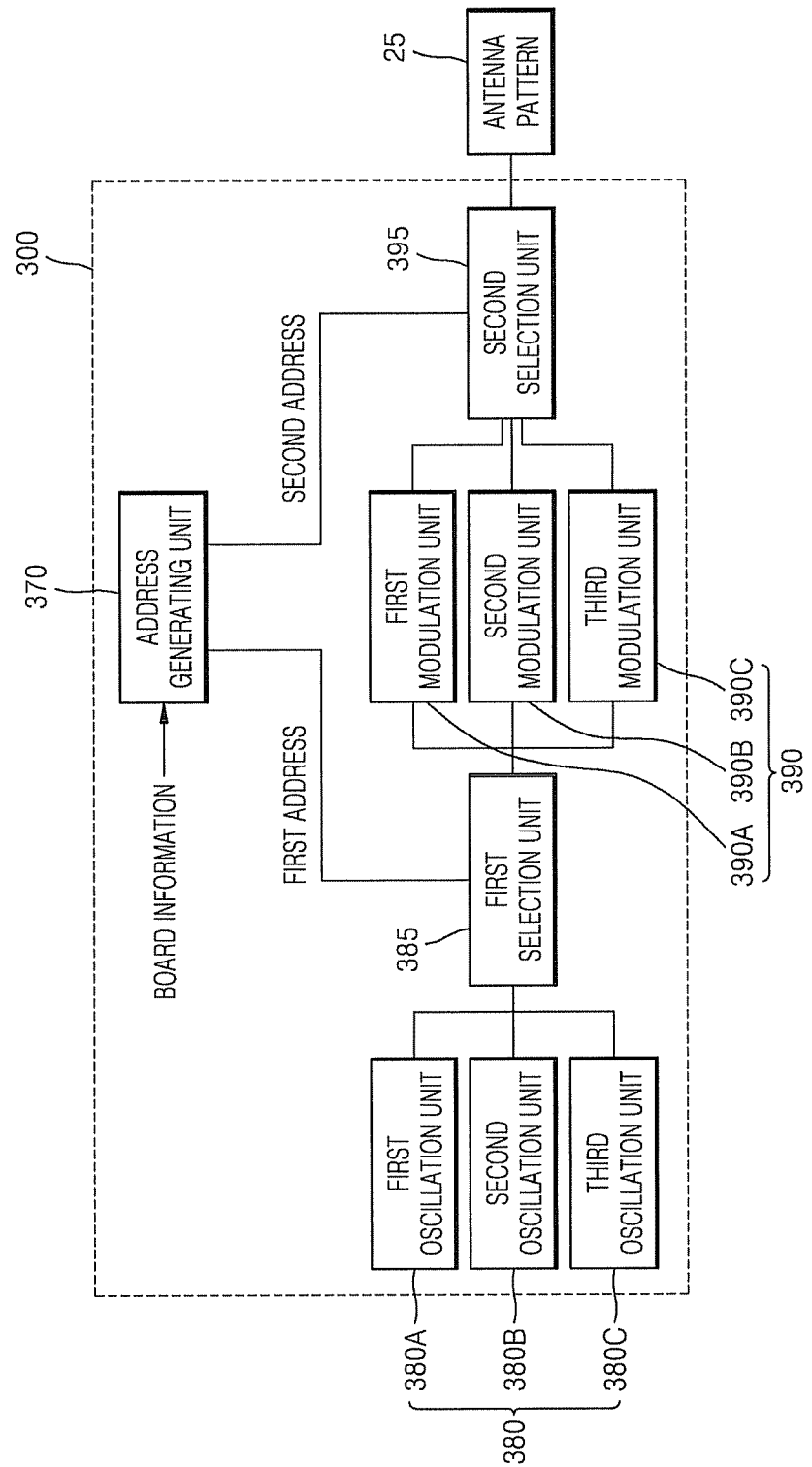
FIG. 12 is a block diagram of the drive circuit of the semiconductor package 700, according to example embodiments of the inventive concepts.

FIG. 11 illustrates a sectional view of the semiconductor package 700 according to example embodiments of the inventive concepts. Furthermore, FIG. 12 is a block diagram of the drive circuit 300 of the semiconductor package 700, according to example embodiments of the inventive concepts. The drive circuit 300 and the semiconductor package 700 according to example embodiments are partial modifications of the drive circuit 300 of FIG. 7 and the semiconductor package 700 of FIG. 5. Any descriptions that are the same as the descriptions given above will be omitted below.

Referring to FIGS. 11 and 12, a plurality of oscillation units 380A, 380B, and 380C and a plurality of modulation units 390A, 390B, and 390C may be arranged in the drive circuit 300. In other words, the drive circuit 300 may include a plurality of the oscillation units 380 to generate an oscillating signal having the same frequency band as a first electromagnetic wave. Furthermore, the drive circuit 300 may further include a first selection unit 385, and the first selection unit 385 may be configured to select at least one of the oscillation units 380A, 380B, and 380C according to a first address.

Similarly, the drive circuit 300 may include the modulation units 390A, 390B, and 390C to generate a modulated signal having the same modulation mode as a first electromagnetic wave and a phase opposite to the phase of the first electromagnetic wave. In other words, the drive circuit 300 may include the plurality of modulation units 390 to generate a modulated signal having the same modulation mode as a first electromagnetic wave and a phase opposite to the phase of the first electromagnetic wave. Furthermore, the drive circuit 300 may further include a second selection unit 395, and the second selection unit 395 may be configured to select at least one of the modulation units 390A, 390B, and 390C according to a second address.

In detail, the semiconductor substrate 600, on which the first semiconductor chip 500 is mounted, may be mounted on a board 800. In example embodiments, the board 800, which may be electrically connected to the first semiconductor chip 500, may affect EMI characteristics of the first semiconductor chip 500, and thus frequency band, modulation mode, phase, and directivity of a first electromagnetic wave may be determined according to the type of the board 800.

Therefore, in this case, the drive circuit 300 may further include an address generating unit 370 to offset different types of first electromagnetic waves that may be generated by different types of the boards 800. For example, the address generating unit 370 may be configured to generate a first address and a second address for selectively operating the oscillation units 380A, 380B, and 380C and the modulation units 390A, 390B, and 390C, according to board information.

Therefore, the address generating unit 370 may generate a first address signal for generating an oscillating signal having the same frequency band as a first electromagnetic wave, based on board information. Furthermore, the address generating unit 370 may generate a second address signal for generating a modulated signal having the same modulation mode as a first electromagnetic wave and a phase opposite to a phase of the first electromagnetic wave, based on board information.

In example embodiments, the film substrate 50 may further include a second via contact 17 through which board information may be received from the board 800. In other words, the second via contact 17 may receive board information via the external terminal 610 of the substrate 600 and transmit the board information to the drive circuit 800 of the EMI removing device 100.

Figure 13:
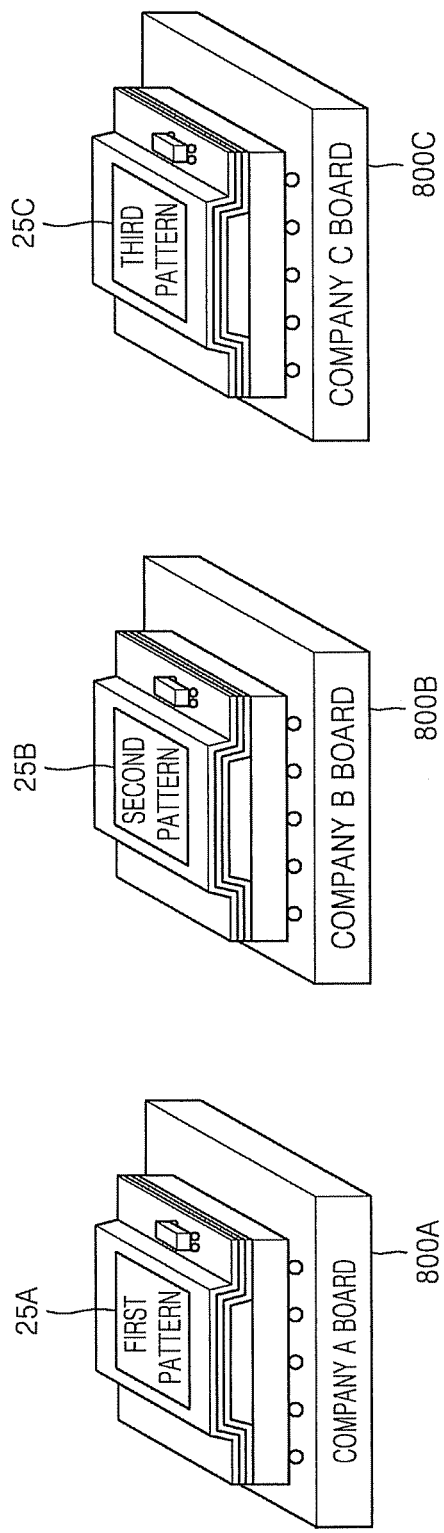
FIG. 13 is a flowchart of a method of operating a semiconductor package according to example embodiments of the inventive concepts.
Figure 14:
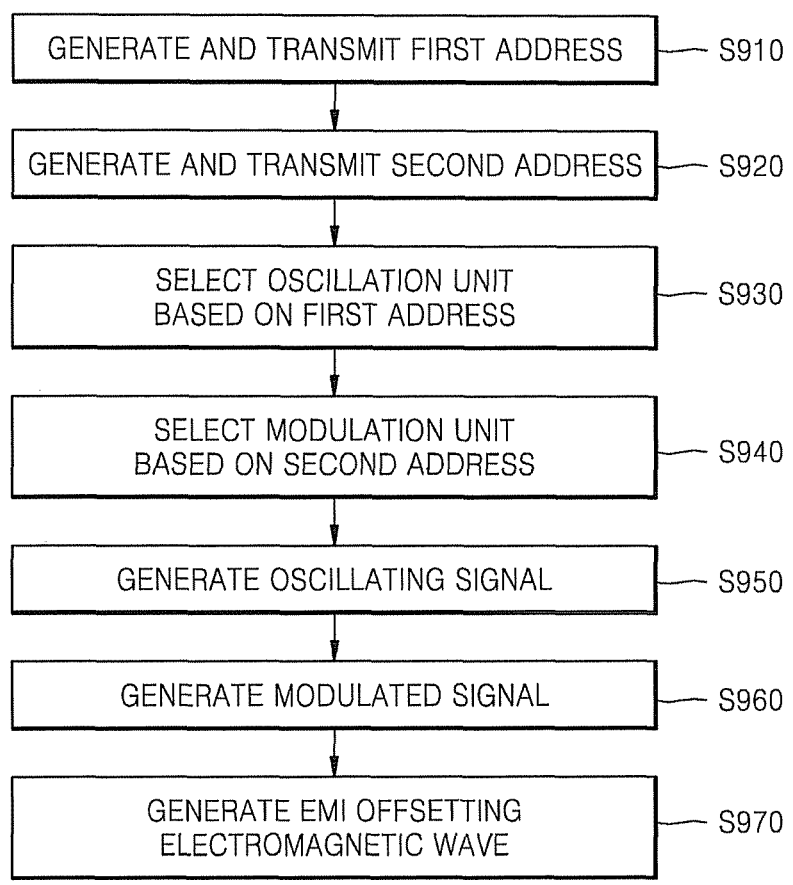
FIG. 14 is a flowchart of a method of operating a semiconductor package according to example embodiments of the inventive concepts.

FIGS. 13 and 14 illustrate respectively a table and a flowchart and for describing operations of the semiconductor package 700 according to example embodiments of the inventive concepts.

Referring to FIGS. 12, 13, and 14, when the semiconductor package 700 is mounted on a company A board 800A, for example, the first semiconductor chip 500 may generate a first electromagnetic wave, which has a frequency band between 800 Mhz and 900 Mhz, is modulated in a first modulation mode, propagates in a uniform radial shape, and has a linear polarization characteristic. In this case, the address generating unit 370 may generate a first address signal for driving the first oscillation unit 380A based on board information regarding the company A board 800A and transmit the first address signal to the first selection unit 385 (operation S910). Furthermore, the address generating unit 370 may generate a second address for driving the first modulation unit 390A and transmit the second address to the second selection unit 395 (operation S920).

Accordingly, the first oscillation unit 380A and the first modulation unit 390A may be selected by the first selection unit 385 and the second selection unit 395, respectively (operations S930 and S940). Furthermore, the film substrate 50, on which an antenna pattern 25A including a first pattern is embodied, may be attached onto the semiconductor package 700, wherein the first pattern may generate an electromagnetic wave, which propagates in a uniform radial shape and has linear polarization characteristics. As a result, an oscillating signal and a modulation signal are generated by the drive circuit 300 (operations S950 and S960), and a second electromagnetic wave, which has the same frequency band, modulation mode, and directivity as the first electromagnetic wave and has a phase opposite to a phase of the first electromagnetic wave, is generated by the antenna pattern 25A (operation S970), and thus interference due to the first electromagnetic wave may be offset.

Furthermore, when the semiconductor package 700 is mounted on a company B board 800B, for example, the first semiconductor chip 500 may generate a first electromagnetic wave, which has a frequency band between 1.3 Ghz and 1.4 Ghz, is modulated in a first modulation mode, propagates in a direction vertical to the company B board 800B, and has linear polarization characteristics. In this case, the address generating unit 370 may generate a first address signal for driving the second oscillation unit 380B based on board information regarding the company B board 800B and transmit the first address signal to the first selection unit 385 (operation S910). Furthermore, the address generating unit 370 may generate a second address for driving the first modulation unit 390A and transmit the second address to the second selection unit 395 (operation S920).

Accordingly, the second oscillation unit 380B and the first modulation unit 390A are selected by the first selection unit 385 and the second selection unit 395, respectively (operations S930 and S940). Furthermore, the film substrate 50, on which an antenna pattern 25B including a second pattern is embodied, is attached onto the semiconductor package 700, wherein the second pattern may generate an electromagnetic wave, which propagates in a direction vertical to the company B board 800B and has linear polarization characteristics. As a result, an oscillating signal and a modulation signal are generated by the drive circuit 300 (operations 5950 and S960), and interference due to the first electromagnetic wave may be offset by the antenna pattern 25B.

In the same regard, when the semiconductor package 700 is mounted on a company C board 800C, for example, the first semiconductor chip 500 may generate a first electromagnetic wave, which has a frequency band between 800 Mhz and 900 Mhz, is modulated in a second modulation mode, propagates in a direction vertical to the company C board 800C, and has circular polarization characteristics. In this case, the address generating unit 370 may generate a first address signal for driving the first oscillation unit 380A based on board information regarding the company C board 800C and transmit the first address signal to the first selection unit 385 (operation S910). Furthermore, the address generating unit 370 may generate a second address for driving the second modulation unit 390B and transmit the second address to the second selection unit 395 (operation S920).

Accordingly, the first oscillation unit 380A and the second modulation unit 390B may be selected by the first selection unit 385 and the second selection unit 395, respectively (operations 5930 and S940). Furthermore, the film substrate 50, on which an antenna pattern 25C including a third pattern is embodied, is attached onto the semiconductor package 700, wherein the third pattern may generate an electromagnetic wave, which propagates in a direction vertical to the company C board 800C and has circular polarization characteristics. As a result, an oscillating signal and a modulation signal are generated by the drive circuit 300 (operations 5950 and S960), and interference due to the first electromagnetic wave may be offset by the antenna pattern 25C.

In detail, an EMI-electromagnetic wave may be offset by detecting the EMI-electromagnetic wave formed outside a semiconductor package and generating an electromagnetic wave, which has the same frequency band, modulation mode, and directivity as the EMI-electromagnetic wave and has a phase opposite to a phase of the EMI-electromagnetic wave. Furthermore, even if the EMI-electromagnetic wave has a different frequency band, modulation mode, phase, and directivity according to working environment, an electromagnetic wave, which has the same frequency band, modulation mode, and directivity as the EMI-electromagnetic wave and has a phase opposite to a phase of the EMI-electromagnetic wave, may be generated by selecting an oscillation unit and a modulation unit based on board information. Furthermore, since an antenna pattern is embodied on a detachable tape type film substrate, another EMI removing device with a new design may be easily applied according to changes of board information. In other words, since the shape of an antenna pattern may be determined based on the type of board, interference with respect to surrounding devices may be effectively removed.

It shall be understood that the shapes of elements or the like shown in figures are merely examples and various changes may be made therein. Like reference numerals denotes like elements.

While example embodiments of the inventive concepts have been particularly shown and described with reference to example embodiments thereof, it will be understood that various changes in form and details may be made therein without departing from the spirit and scope of the following claims.

What is claimed is:

1. A semiconductor package comprising:
  at least one first semiconductor chip, the at least one first semiconductor chip configured to generate a first electromagnetic wave; and
  an electromagnetic interference (EMI) removing device arranged outside the at least one first semiconductor chip, the EMI removing device being configured to generate a second electromagnetic wave having a phase opposite to a phase of the first electromagnetic wave.

2. The semiconductor package of claim 1, wherein the first electromagnetic wave and the second electromagnetic wave have substantially a same frequency band, modulation mode, and directivity.

3. The semiconductor package of claim 1, further comprising:
  a sealing member sealing the at least one first semiconductor chip, wherein
  the EMI removing device includes a film substrate on the sealing member and a drive circuit on the film substrate, the film substrate includes an antenna pattern, and the drive circuit is configured to generate and transmit a modulated signal to the antenna pattern to generate the second electromagnetic wave.

4. The semiconductor package of claim 3, wherein the EMI removing device further includes a second semiconductor chip on the film substrate and the second semiconductor chip includes the drive circuit.

5. The semiconductor package of claim 3, wherein the film substrate further includes at least one via contact electrically connected to the drive circuit, wherein the at least one via contact contacts one of a lead frame and a through mold via (TMV) exposed by the sealing member.

6. The semiconductor package of claim 3, further comprising:
  a fixing unit, the fixing unit fixing the film substrate to a substrate supporting the at least one first semiconductor chip.

7. The semiconductor package of claim 3, wherein the film substrate further includes
  a base film and a first adhesive layer between the base film and the sealing member and the antenna pattern is on a first surface of the base film.

8. The semiconductor package of claim 7, wherein the film substrate further includes a second adhesive layer covering the antenna pattern and
  a protective layer on the second adhesive layer.

9. The semiconductor package of claim 3, wherein the antenna pattern is configured to generate the second electromagnetic wave, the second electromagnetic wave having substantially a same directivity as the first electromagnetic wave.

10. The semiconductor package of claim 3, wherein the drive circuit includes
  an oscillation unit configured to generate an oscillating signal having a same frequency band as the first electromagnetic wave, and
  a modulation unit configured to generate the modulated signal for generating the second electromagnetic wave, the modulation unit generating the modulated signal based on the oscillating signal.

11. The semiconductor package of claim 10, wherein
  the oscillation unit comprises a plurality of oscillation units, and
  the drive circuit further includes a first selection unit configured to select at least one oscillation unit from among the plurality of oscillation units.

12. The semiconductor package of claim 10, wherein
  the modulation unit includes a plurality of modulation units, and
  the drive circuit further includes a second selection unit configured to select at least one modulation unit from among the plurality of modulation units.

13. The semiconductor package of claim 10, wherein the oscillation unit includes a crystal oscillator configured to generate a first signal having a first frequency, a voltage-controlled oscillator configured to generate a second signal having a second frequency, which is higher than the first frequency, based on a parameter voltage, a divider configured to convert the second signal to a comparative signal having the first frequency, a phase detector configured to generate a pulse signal based on a difference between a phase of the first signal and a phase of the comparative signal, and a pulse-voltage converter configured to convert the pulse signal to the parameter voltage.

14. The semiconductor package of claim 1 further comprising:

a sealing member sealing the at least one first semiconductor chip, wherein the EMI removing device includes a film substrate on the sealing member, the film substrate includes an antenna pattern configured to generate the second electromagnetic wave, the second electromagnetic wave having a same frequency band, modulation mode, and directivity as the first electromagnetic wave, the EMI removing device further includes a second semiconductor chip on the film substrate, and the second semiconductor chip is configured to generate and transmit a modulated signal to the antenna pattern to generate the second electromagnetic wave.

15. The semiconductor package of claim 14, wherein the semiconductor package is configured to mount on a board and a shape of the antenna pattern is determined based on the of the board.

16. The semiconductor package of claim 14, wherein the second semiconductor chip includes a plurality of oscillation units configured to generate oscillating signals having a same frequency band as the first electromagnetic wave, and a plurality of modulation units configured to generate modulated signals having a same modulation mode as the first electromagnetic wave and having a phase opposite to a phase of the first electromagnetic wave, the plurality of modulation units generating the modulated signals based on the oscillating signals.

17. The semiconductor package of claim 16, wherein the second semiconductor includes an address generating unit configured to generate a first address and a second address based on a board, a first selection unit configured to select at least one oscillation unit from among the plurality of oscillation units according to the first address, and a second selection unit configured to select at least one modulation unit from among the plurality of modulation units according to the second address.

18. An electromagnetic interference (EMI) removing device comprising:

a film substrate having an antenna pattern configured to generate a second electromagnetic wave having a same frequency band, modulation mode, and directivity as a first electromagnetic wave generated by a first semiconductor chip, the second electromagnetic wave having a phase opposite to a phase of the first electromagnetic wave.

19. The EMI removing device of claim 18, further comprising:

a semiconductor chip on the film substrate, wherein the semiconductor chip is configured to generate a modulated signal for generating the second electromagnetic wave and transmit the modulated signal to the antenna pattern.

20. The EMI removing device of claim 18, wherein the film substrate includes a base film having a first surface and a second surface opposite to the first surface, the base film having the antenna pattern arranged thereon, a first adhesive layer on the first surface of the base film, a second adhesive layer on the second surface of the base film, the second adhesive layer covering the antenna pattern, and a protective layer on the second adhesive layer.

21. An electromagnetic interference (EMI) removing device comprising:

a first adhesive layer;

a base film on the first adhesive layer;

an antenna pattern and a wiring pattern on the base film; and a drive circuit on the base film, the drive circuit including an oscillation unit and a modulation unit configured to generate and transmit a modulated signal to the antenna pattern, wherein the oscillation unit includes:

a first oscillator configured to generate a first signal having a first frequency and a first phase, a voltage controlled oscillator configured to generate a second signal having a second frequency and a second phase, a divider configured to convert the second signal to a comparative signal having the first frequency and the second phase, a phase detector configured to compare the first and second phase and to generate a pulse signal based on a difference of the first and second phases, and a pulse voltage converter configured to convert the pulse signal into a parameter voltage, wherein the voltage controlled oscillator generates the second signal based on the parameter voltage.

22. The EMI removing device according to claim 21, further comprising:

a first via contact penetrating the base film and the first adhesive layer, wherein the first via contact is electrically connected to the drive circuit.

23. The EMI removing device according to claim 22, further comprising:

a second via contact penetrating the base film and the first adhesive layer, wherein the second via contact is electrically connected to the drive circuit and is configured to receive external device information.

24. The EMI removing device according to claim 23, wherein the drive circuit includes an address generating unit configured to use the external device information to generate first address data for a first selection unit and second address data for a second selection unit, the first selection unit is configured to select an oscillation unit from a plurality of oscillation units to generate a first signal, the second selection unit is configured to select a modulation unit from a plurality of modulation units, and the selected oscillation unit and the selected modulation unit are used to generate and send the modulated signal to the antenna pattern.

* * * * *